(12) United States Patent
Long et al.

(10) Patent No.: US 12,512,628 B2
(45) Date of Patent: Dec. 30, 2025

(54) RECEPTACLE CAGE HAVING EMI SHIELDING

(71) Applicant: TE Connectivity Solutions GmbH, Schaffhausen (CH)

(72) Inventors: Richard James Long, Columbia, PA (US); Alex Michael Sharf, Harrisburg, PA (US); Freddy R. Galindo Palomino, Harrisburg, PA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 407 days.

(21) Appl. No.: 17/986,079

(22) Filed: Nov. 14, 2022

(65) Prior Publication Data

US 2024/0162665 A1 May 16, 2024

(51) Int. Cl.
| | |
|---|---|
| *H01R 13/6582* | (2011.01) |
| *H01R 13/6581* | (2011.01) |
| *H01R 13/6583* | (2011.01) |
| *H01R 13/6591* | (2011.01) |
| *H01R 13/6596* | (2011.01) |
| *H05K 9/00* | (2006.01) |
| *H01R 13/502* | (2006.01) |
| *H01R 13/6584* | (2011.01) |
| *H01R 13/6594* | (2011.01) |

(52) U.S. Cl.
CPC ..... *H01R 13/6582* (2013.01); *H01R 13/6581* (2013.01); *H01R 13/6583* (2013.01); *H01R 13/6591* (2013.01); *H01R 13/6596* (2013.01); *H05K 9/0052* (2013.01); *H01R 13/502* (2013.01); *H01R 13/6584* (2013.01); *H01R 13/6594* (2013.01); *H01R 2201/04* (2013.01); *H05K 9/0049* (2013.01); *H05K 9/0058* (2013.01)

(58) Field of Classification Search
CPC ............ H01R 13/6582; H01R 13/6581; H01R 13/6583; H01R 13/6591; H01R 13/6596; H01R 13/502; H01R 13/6584; H01R 13/6594; H01R 2201/04; H05K 9/0052; H05K 9/0049; H05K 9/0058
See application file for complete search history.

(56) References Cited

U.S. PATENT DOCUMENTS 11,792,958 B2 * 10/2023 Yen .................... H05K 7/20472
165/80.3

* cited by examiner

*Primary Examiner* — Justin M Kratt

(57) ABSTRACT

A receptacle connector assembly includes a receptacle cage having shielding walls including a top wall, a first side wall extending from the top wall to a bottom of the receptacle cage, and a second side wall extending from the top wall opposite the first side wall to the bottom of the receptacle cage. The receptacle connector assembly includes an EMI shield coupled to the receptacle cage at the front end. The EMI shield has a shield member including a base electrically connected to the receptacle cage and spring fingers that extend from the base to distal ends. The EMI shield includes a gasket between the receptacle cage and the corresponding spring fingers. The gasket electrically connects the corresponding spring fingers to the receptacle cage.

21 Claims, 5 Drawing Sheets

RECEPTACLE CAGE HAVING EMI SHIELDING

BACKGROUND OF THE INVENTION

The subject matter herein relates generally to communication systems.

Some communication systems utilize communication connectors to interconnect various components of the system for data communication. Some known communication systems use pluggable modules, such as I/O modules, that are electrically connected to the communication connector. Known communication systems provide electrical shielding, such as in the form of a receptacle cage surrounding the communication connector and the pluggable module to provide electrical shielding. Some receptacle cages provide an electromagnetic interference (EMI) shield at the front end of the receptacle cage including EMI springs for interfacing with a panel or other grounding structure. The However, the EMI springs make poor contact with the receptacle cage, such as due to manufacturing tolerances or over-bending of the EMI springs prior to or during assembly. The poor contact leads to a diminished performance.

A need remains for a receptacle cage having improved EMI shielding.

BRIEF DESCRIPTION OF THE INVENTION

In one embodiment, a receptacle connector assembly is provided and includes a receptacle cage having shielding walls that extend between a front end and a rear end of the receptacle cage. The shielding walls include a top wall, a first side wall extending from the top wall to a bottom of the receptacle cage, and a second side wall extending from the top wall opposite the first side wall to the bottom of the receptacle cage. The top wall, the first side wall and the second side wall form a module channel configured to receive a pluggable module. The front end has a port open to the pluggable module to receive the pluggable module. The receptacle connector assembly includes an EMI shield coupled to the receptacle cage at the front end. The EMI shield has a shield member including a base coupled to at least one of the shielding walls to electrically connect the EMI shield to the receptacle cage. The shield member includes spring fingers that extend from the base to distal ends. Each spring finger includes a panel interface configured to engage a panel surrounding the receptacle cage to electrically connect the EMI shield to the panel. The EMI shield includes at least one gasket between the receptacle cage and the corresponding spring fingers. The at least one gasket electrically connects the corresponding spring finger to the receptacle cage.

In another embodiment, a receptacle connector assembly is provided and includes a receptacle cage having shielding walls that extend between a front end and a rear end of the receptacle cage. The shielding walls include a top wall, a first side wall extending from the top wall to a bottom of the receptacle cage, and a second side wall extending from the top wall opposite the first side wall to the bottom of the receptacle cage. The top wall, the first side wall and the second side wall form a module channel configured to receive a pluggable module. The front end has a port open to the pluggable module to receive the pluggable module. The receptacle connector assembly includes an EMI shield coupled to the receptacle cage at the front end. The EMI shield has an upper shield member including an upper base coupled to the top wall to electrically connect the EMI shield to the top wall. The upper shield member includes upper spring fingers that extend from the upper base to distal ends. Each upper spring finger includes a panel interface configured to engage a panel surrounding the receptacle cage to electrically connect the upper shield member to the panel. The EMI shield includes an upper gasket between the receptacle cage and the upper spring fingers. The upper gasket electrically connecting the upper spring fingers. The upper gasket electrically connects the upper spring fingers to the top wall.

In a further embodiment, a receptacle connector assembly is provided and includes a receptacle cage having shielding walls that extend between a front end and a rear end of the receptacle cage. The shielding walls include a top wall, a first side wall extending from the top wall to a bottom of the receptacle cage, and a second side wall extending from the top wall opposite the first side wall to the bottom of the receptacle cage. The top wall, the first side wall and the second side wall form a module channel configured to receive a pluggable module. The front end has a port open to the pluggable module to receive the pluggable module. The receptacle cage includes troughs along the exterior of the shielding walls. The receptacle connector assembly includes an EMI shield coupled to the receptacle cage at the front end. The EMI shield has a shield member including a base coupled to at least one of the shielding walls to electrically connect the EMI shield to the receptacle cage. The shield member includes spring fingers that extend from the base to distal ends, each spring finger includes a panel interface configured to engage a panel surrounding the receptacle cage to electrically connect the EMI shield to the panel. The EMI shield includes gaskets between the receptacle cage and the corresponding spring fingers. The gaskets are received in the corresponding troughs. The gaskets electrically connect the corresponding spring finger to the receptacle cage.

DETAILED DESCRIPTION OF THE INVENTION

Figure 1:
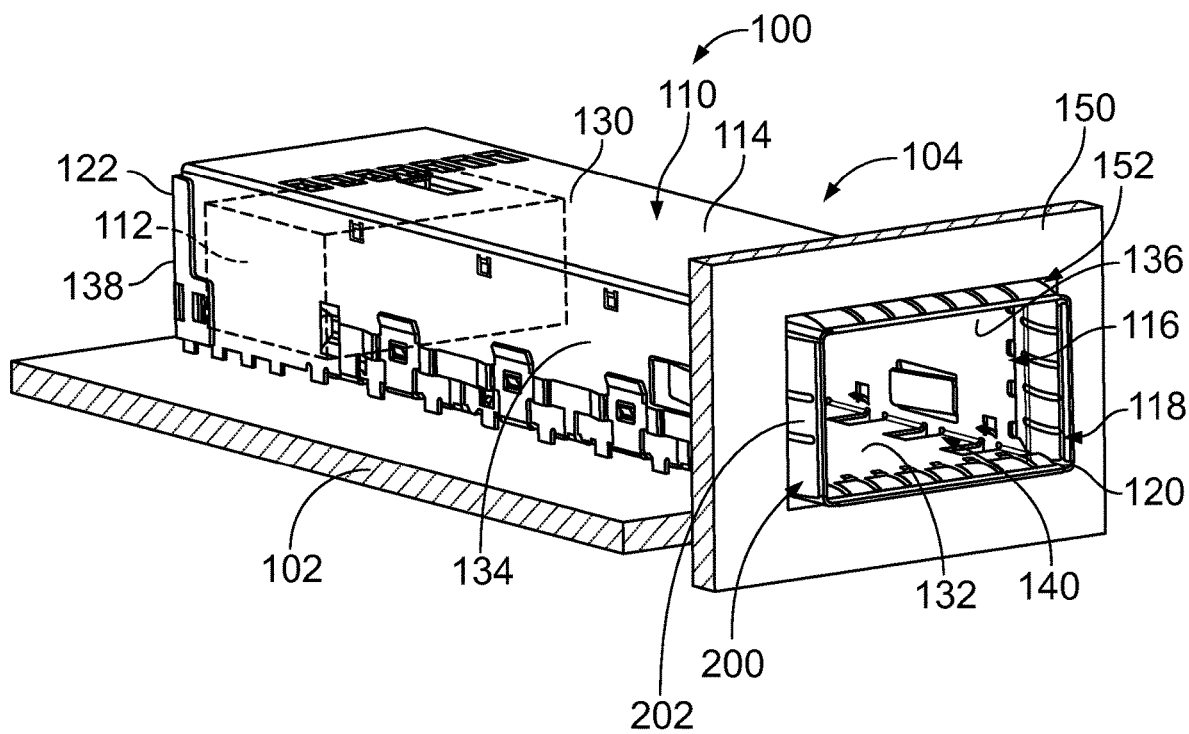
FIG. 1 is a front perspective view of a communication system formed in accordance with an exemplary embodiment.

FIG. 1 is a front perspective view of a communication system 100 formed in accordance with an exemplary embodiment. The communication system 100 includes a host circuit board 102 and a receptacle connector assembly 104 mounted to the host circuit board 102. The receptacle connector assembly 104 is configured to receive a pluggable module 106 (example shown in FIG. 2). The receptacle connector assembly 104 is configured to be electrically connected to the host circuit board 102 by the receptacle connector assembly 104.

In an exemplary embodiment, the receptacle connector assembly 104 includes a receptacle cage 110 and a communication connector 112 (shown in phantom) adjacent the receptacle cage 110. The communication connector 112 may be received in the receptacle cage 110. In other various embodiments, the communication connector 112 may be located rearward of the receptacle cage 110. In various embodiments, the receptacle cage 110 is enclosed and provides electrical shielding for the communication connector 112. In an exemplary embodiment, the receptacle cage 110 is a stamped and formed cage member that includes a plurality of shielding walls 114 that define one or more module channels for receipt of corresponding pluggable modules 106.

In the illustrated embodiment, the receptacle cage 110 is a single port receptacle cage configured to receive a single pluggable module 106. In other various embodiments, the receptacle cage 110 may be a ganged cage member having a plurality of ports ganged together in a single row and/or a stacked cage member having multiple ports stacked as an upper port and a lower port.

The receptacle cage 110 includes a module channel 116 having a module port 118 open to the module channel 116. The module channel 116 receives the pluggable module 106 through the module port 118. In an exemplary embodiment, the receptacle cage 110 extends between a front end 120 and a rear end 122. The module port 118 is provided at the front end 120. Any number of module channels 116 may be provided in various embodiments arranged in a single column or in multiple columns (for example, 2×2, 3×2, 4×2, 4×3, 4×1, 2×1, and the like). Optionally, multiple communication connectors 112 may be arranged within the receptacle cage 110, such as when multiple rows and/or columns of module channels 116 are provided.

In an exemplary embodiment, the shielding walls 114 of the receptacle cage 110 include a first end wall 130, a second end wall 132, a first side wall 134, and a second side wall 136. The side walls 134, 136 extend between the end walls 130, 132. In various embodiments, the first end wall 130 is at a top of the receptacle cage 110, and thus defines a top wall 130, and the second end wall 132 is at a bottom of the receptacle cage 110, and thus defines a bottom wall 132. Other orientations are possible in alternative embodiments, such as the second end wall 132 or one of the side walls 134, 136 defining the top wall. The bottom wall 132 may face, and possibly rest on, the host circuit board 102. In various embodiments, the receptacle cage 110 may be provided without the bottom wall 132. Optionally, the walls 114 of the receptacle cage 110 may include a rear wall 138 at the rear end 122.

The shielding walls 114 define a cavity 140. For example, the cavity 140 may be defined by the first end wall 130, the second end wall 132, the side walls 134, 136 and the rear wall 138. The cavity 140 includes the module channel 116. In various embodiments, the cavity 140 receives the communication connector 112, such as at the rear end 122. Other walls 114 may separate or divide the cavity 140 into additional module channels 116, such as in embodiments using ganged and/or stacked receptacle cages. For example, the walls 114 may include one or more vertical divider walls between ganged module channels 116. In various embodiments, the walls 114 may include a separator panel between stacked upper and lower module channels 116. The separator panel may include an upper panel and a lower panel that form a space between the upper and lower module channels 116, such as for airflow, for a heat sink, for routing light pipes, or for other purposes.

In an exemplary embodiment, the receptacle cage 110 includes an EMI shield 200 at the front end 120 for providing electrical shielding for the module channels 116. For example, the EMI shield 200 may be provided at the port 118 to electrically connect with the pluggable module 106 received in the module channel 116. In an exemplary embodiment, the EMI shield 200 is provided around the exterior of the receptacle cage 110 for interfacing with a panel 150, such as when the front end 120 of the receptacle cage 110 extends through a cutout 152 in the panel 150. The EMI shield 200 may include spring fingers or other deflectable features that are configured to be spring biased against the panel 150 to create an electrical connection with the panel 150. The EMI shield 200 may include spring fingers or other deflectable features that are configured to be spring biased against the pluggable module 106 to create an electrical connection with the pluggable module 106. The EMI shield 200 includes shield members 202 extending along the shielding walls 114. In various embodiments, the shield members 202 are separate and discrete shield members 202 provided on the corresponding shielding walls 114. In other various embodiments, the shield members 202 are integrated as a unitary structure with different segments extending along the corresponding shielding walls 114.

Optionally, the receptacle connector assembly 104 may include one or more heat sinks (not shown) for dissipating heat from the pluggable modules 106. For example, the heat sink may be coupled to the top wall 130 for engaging the pluggable module 106 received in the module channel 116. The heat sink may extend through an opening in the top wall 130 to directly engage the pluggable module 106. Other types of heat sinks may be provided in alternative embodiments.

In an exemplary embodiment, the pluggable modules 106 are loaded through the port 118 at the front end 120 to mate with the communication connector 112. The shielding walls 114 of the receptacle cage 110 provide electrical shielding around the communication connector 112 and the pluggable module 106, such as around the mating interface between the communication connector 112 and the pluggable module 106.

Figure 2:
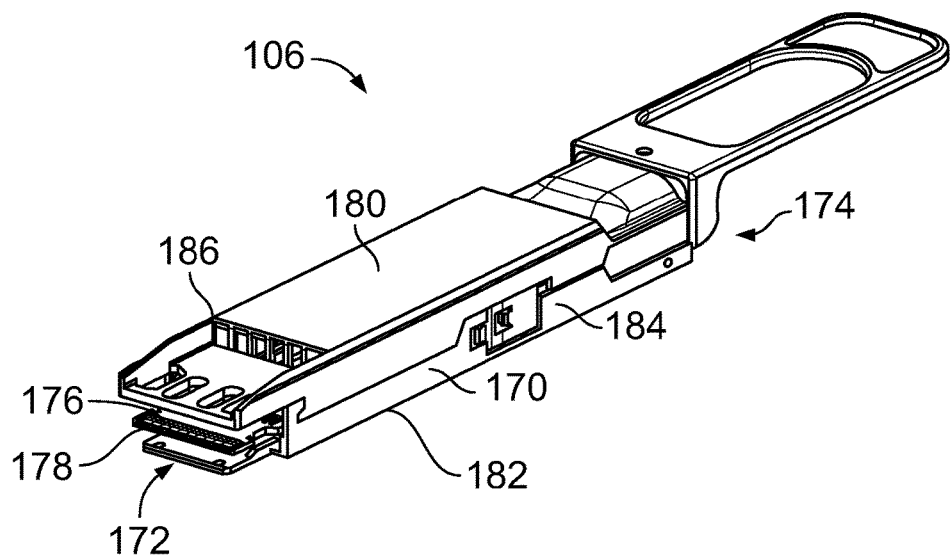
FIG. 2 is a perspective view of the pluggable module in accordance with an exemplary embodiment.

FIG. 2 is a perspective view of the pluggable module 106 in accordance with an exemplary embodiment. The pluggable module 106 has a pluggable body 170, which may be defined by one or more shells. The pluggable body 170 may be thermally conductive and/or may be electrically conductive, such as to provide EMI shielding for the pluggable module 106. The pluggable body 170 includes a mating end 172 and an opposite front end 174. The mating end 172 is configured to be inserted into the corresponding module channel 116 (shown in FIG. 1). The front end 174 may be a cable end having a cable extending therefrom to another component within the system.

The pluggable module 106 includes a connector interface, such as a module circuit board 176, which is configured to be communicatively coupled to the communication connector 112 (shown in FIG. 1). The module circuit board 176 may be accessible at the mating end 172. The module circuit board 176 has a mating edge 178 and mating contacts at the mating edge 178 configured to be mated with the communication connector 112. The module circuit board 176 may include components, circuits and the like used for operating and/or using the pluggable module 106. For example, the module circuit board 176 may have conductors, traces, pads, electronics, sensors, controllers, switches, inputs, outputs, and the like associated with the module circuit board, which may be mounted to the module circuit board 176, to form various circuits. In various embodiments, the pluggable module 106 may be a fiber optic module. The connector interface(s) may include fiber optic cables and/or optical generators to transmit optical signals.

The pluggable module 106 includes an outer perimeter defining an exterior of the pluggable body 170. For example, the outer perimeter may be defined by a top 180, a bottom 182, a first side 184 and a second side 186. The pluggable body 170 may have other shapes in alternative embodiments. The top 180, the bottom 182, the first side 184 and the second side 186 may have flat surfaces, such as to receive the spring fingers of the EMI shield 200 (shown in FIG. 1).

In an exemplary embodiment, the pluggable body 170 provides heat transfer for the module circuit board 176, such as for the electronic components on the module circuit board 176. For example, the module circuit board 176 is in thermal communication with the pluggable body 170 and the pluggable body 170 transfers heat from the module circuit board 176. Optionally, the pluggable body 170 may include a plurality of heat transfer fins (not shown) along at least a portion of the outer perimeter of the pluggable module 106, such as along the top, for dissipating heat from the pluggable body 170. A plate may connect the distal ends of the heat transfer fins to form a planar, flat surface, such as for interfacing with a heat sink.

Figure 3:
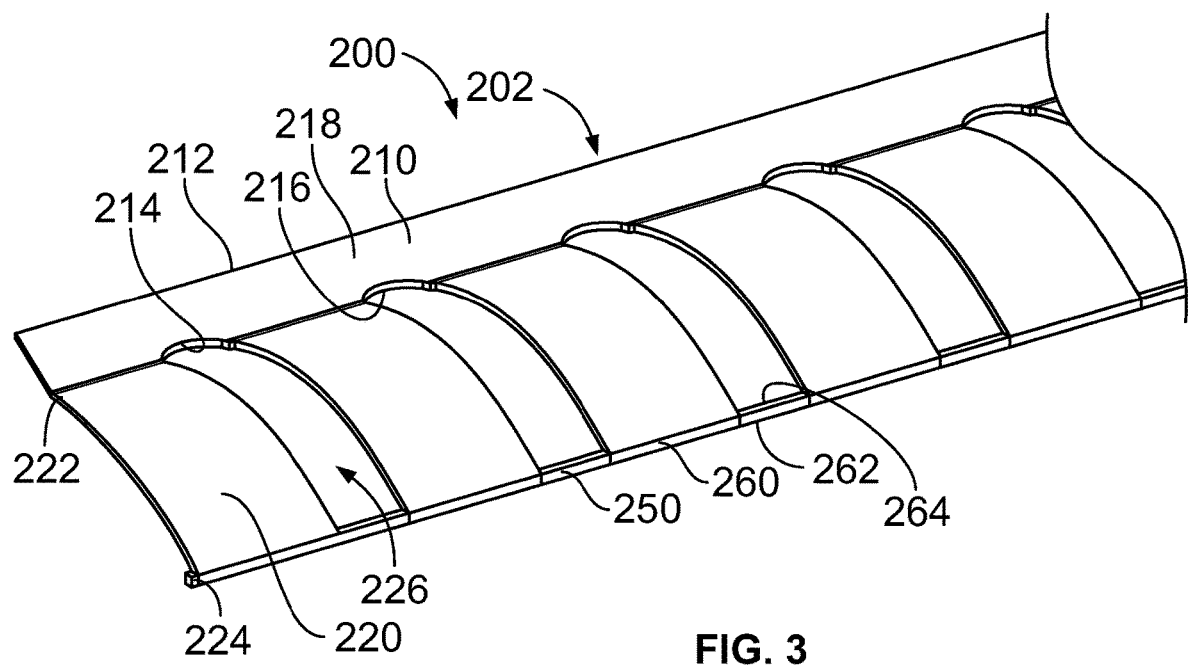
FIG. 3 is a perspective view of a portion of the EMI shield showing a portion of the shield member in accordance with an exemplary embodiment.

FIG. 3 is a perspective view of a portion of the EMI shield 200 showing a portion of the shield member 202 in accordance with an exemplary embodiment. The shield member 202 includes a base 210 and a plurality of spring fingers 220 extending from the base 210. The EMI shield 200 includes at least one gasket 250. The gasket 250 is compressible. The gasket 250 is electrically conductive. The gasket 250 is configured to electrically connect the corresponding spring finger(s) 220 and the receptacle cage 110 (shown in FIG. 1). The gasket 250 defines a conduit through which the EMI shield 200 is electrically connected to the receptacle cage 110.

The base 210 includes a front edge 212 and a rear edge 214. The spring fingers 220 extend rearward from the rear edge 214. The base 210 includes an inner surface 216 and an outer surface 218. The inner surface 216 is configured to be coupled to the receptacle cage 110.

Each spring finger 220 extends between a proximal end 222 and a distal end 224. The proximal end 222 is provided at the base 210. The spring fingers 220 may be curved between the proximal end 222 and the distal end 224. The spring finger 220 is deflectable, such as when mating to the receptacle cage 110. Gaps 226 are provided between the spring fingers 220 to allow the spring fingers 220 to be independently deflectable. In an exemplary embodiment, the gasket(s) 250 is coupled to the spring finger(s) 220 at the distal end 224.

The gasket 250 includes a gasket body 260 extending between an inner gasket surface 262 and an outer gasket surface 264. The gasket body 260 is compressible between the inner gasket surface 262 and the outer gasket surface 264. The inner gasket surface 262 is configured to be coupled to the receptacle cage 110. The outer gasket surface 264 is configured to be coupled to the distal end 224 of the corresponding spring finger(s) 220.

In the illustrated embodiment, the gasket 250 is connected to a plurality of the spring fingers 220. For example, the gasket 250 spans across the gaps 226 to connect to multiple spring fingers 220. The gasket 250 electrically connects the spring fingers 220. Optionally, the gasket 250 may be coupled to all of the spring fingers 220. However, in alternative embodiments, separate and discrete gaskets 250 may be provided, such as separate gaskets 250 for each spring finger 220.

Figure 4:
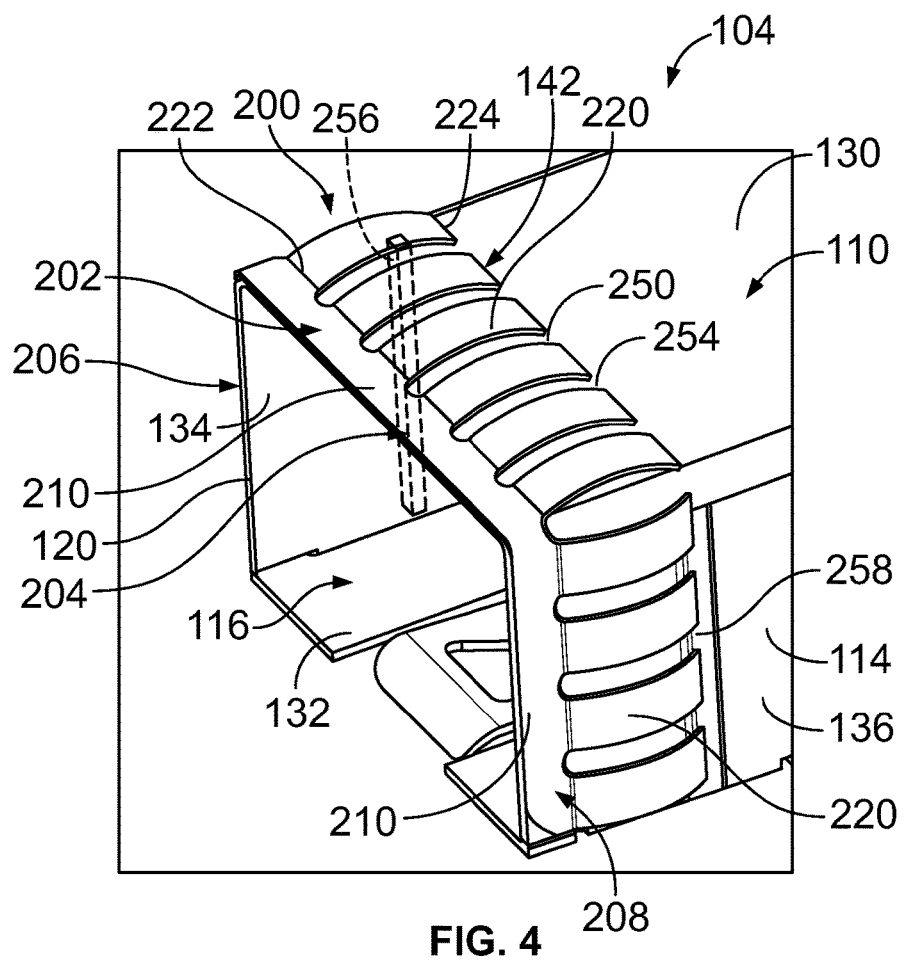
FIG. 4 is a perspective view of a portion of the receptacle connector assembly in accordance with an exemplary embodiment showing the front end of the receptacle cage and the EMI shield.
Figure 5:
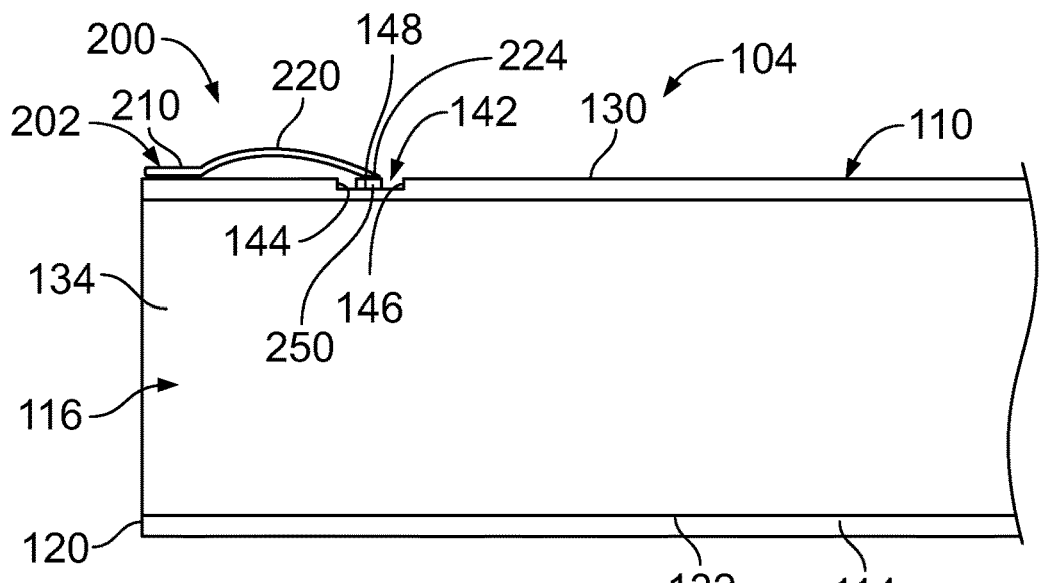
FIG. 5 is a cross sectional view of a front portion of the receptacle connector assembly showing the receptacle cage and the EMI shield in accordance with an exemplary embodiment.

FIG. 4 is a perspective view of a portion of the receptacle connector assembly 104 in accordance with an exemplary embodiment showing the front end 120 of the receptacle cage 110 and the EMI shield 200. FIG. 5 is a cross sectional view of a front portion of the receptacle connector assembly 104 showing the receptacle cage 110 and the EMI shield 200.

The receptacle cage 110 includes the shielding walls 114 that define the module channel 116. In an exemplary embodiment, the shielding walls 114 include the top wall 130, the bottom wall 132, and the side walls 134, 136. In an exemplary embodiment, the EMI shield 200 includes shield members 202 coupled to the top wall 130 and the side walls 134, 136. Such shield members 202 define an upper shield member 204, a first side shield member 206, and a second side shield member 208, respectively. The EMI shield 200 may additionally include a shield member 202 coupled to the bottom wall 132, which may be referred to as a bottom shield member (not shown). The gaskets 250 associated with the shield members 204, 206, 208 define an upper gasket 254, a first side gasket 256 (shown in phantom), and a second side gasket 258, respectively. The EMI shield 200 may additionally include a lower shield member (not shown) associated with the bottom shield member. Each gasket 254, 256, 258 is coupled to multiple spring fingers 220 of the corresponding shield member 204, 206, 208. The gasket 254, 256, 258 electrically connects the spring fingers 220 of the corresponding shield member 204, 206, 208 to each other and to the receptacle cage 110.

In an exemplary embodiment, the receptacle cage 110 includes troughs 142 along the exterior of the shielding walls 114. The troughs 142 are recessed in the shielding walls 114. The troughs 142 may be milled or cut from the shielding walls 114. In other various embodiments, the troughs 142 are coined or pressed into the shielding walls 114. The troughs 142 receive the gaskets 250. In an exemplary embodiment, each trough 142 includes a front step 144, a rear step 146 and an inner surface 148 between the front step 144 and the rear step 146. The gasket 250 is received in the trough 142 between the front and rear steps 144, 146. The gasket 250 may engage the front step 144 and/or the rear step 146. The gasket 250 engages the inner surface 148. In an exemplary embodiment, the gasket 250 is compressed between the spring fingers 220 and the inner surface 148.

The EMI shield 200 is coupled to the receptacle cage 110. The base 210 of each shield member 202 is coupled to the shielding walls 114. For example, the base 210 may be welded or soldered to the corresponding shielding wall 114. In other embodiments, the base 210 may be clipped or otherwise mechanically and electrically connected to the shielding wall 114. The base 210 may be provided at the front end 120. The spring fingers 220 extend rearward from the base 210 for connection to the corresponding shielding wall 114. The spring fingers 220 define multiple points of contact with the receptacle cage 110.

The gaskets 250 form conductive links between the spring fingers 220 and the receptacle cage 110. The gaskets 250 are compressible between the spring fingers 220 and the receptacle cage 110 to take up tolerances between the distal ends 224 of the spring fingers 220 and the receptacle cage 110. The spring fingers 220 may be pressed inward toward the gaskets 250 when plugged into the panel opening of the panel 150 (shown in FIG. 1). In various embodiments, the gaskets 250 may be attached to the spring fingers 220 and connected to the receptacle cage 110 with the shield members 202. The gaskets 250 may be connected to the receptacle cage 110 at separable interfaces. In other embodiments, the gaskets 250 are attached to the receptacle cage 110 and the spring fingers 220 are connected to the gaskets 250 when the shield members 208 are coupled to the receptacle cage 110. The spring fingers 220 may be connected to the gaskets 250 at separable interfaces. In various embodiments, each gasket 250 is a compressible conductive elastomer. In other various embodiments, each gasket 250 is a wire mesh. In other various embodiments, each gasket 250 is a woven metallic braid. In other various embodiments, each gasket 250 is a compressible, looped metal film. In other embodiments, the gasket 250 may be a conductive material, such as a conductive epoxy, applied to the receptacle cage 110 and cured to fix the gasket 250 to the receptacle cage 110.

Figure 6:
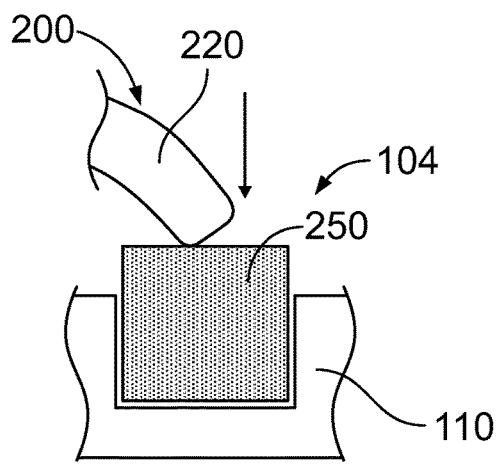
FIG. 6 is a cross sectional view of a portion of the receptacle connector assembly showing the gasket of the EMI shield in accordance with an exemplary embodiment.

FIG. 6 is a cross sectional view of a portion of the receptacle connector assembly 104 showing the gasket 250 of the EMI shield 200 in accordance with an exemplary embodiment. In the illustrated embodiment, the gasket 250 is a conductive elastomer. The conductive elastomer is compressible. The conductive elastomer includes conductive particles embedded in an elastomeric body. The gasket 250 is used to electrically connect the spring finger 220 to the receptacle cage 110. The gasket 250 may be coupled to the spring finger 220 and/or the receptacle cage 110 at a separable interface.

Figure 7:
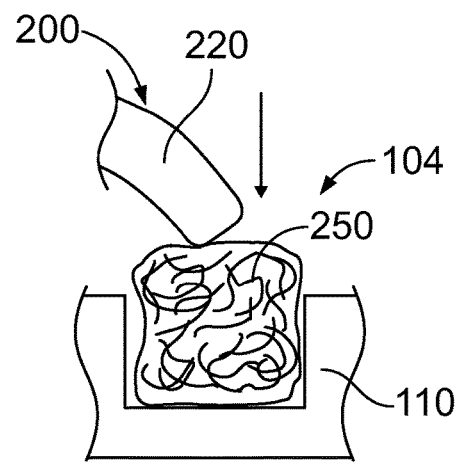
FIG. 7 is a cross sectional view of a portion of the receptacle connector assembly showing the gasket of the EMI shield in accordance with an exemplary embodiment.

FIG. 7 is a cross sectional view of a portion of the receptacle connector assembly 104 showing the gasket 250 of the EMI shield 200 in accordance with an exemplary embodiment. In the illustrated embodiment, the gasket 250 is a wire mesh. The wire mesh is compressible. The wire mesh includes conductive fibers. The gasket 250 is used to electrically connect the spring finger 220 to the receptacle cage 110. The gasket 250 may be coupled to the spring finger 220 and/or the receptacle cage 110 at a separable interface.

Figure 8:
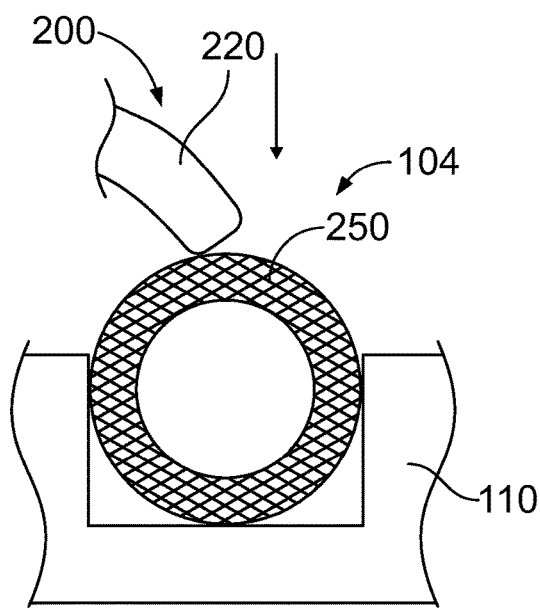
FIG. 8 is a cross sectional view of a portion of the receptacle connector assembly showing the gasket of the EMI shield in accordance with an exemplary embodiment.

FIG. 8 is a cross sectional view of a portion of the receptacle connector assembly 104 showing the gasket 250 of the EMI shield 200 in accordance with an exemplary embodiment. In the illustrated embodiment, the gasket 250 is a woven metallic braid. The woven metallic braid includes conductive wires woven into a braid. The woven metallic braid may be tubular and compressible. The gasket 250 is used to electrically connect the spring finger 220 to the receptacle cage 110. The gasket 250 may be coupled to the spring finger 220 and/or the receptacle cage 110 at a separable interface.

Figure 9:
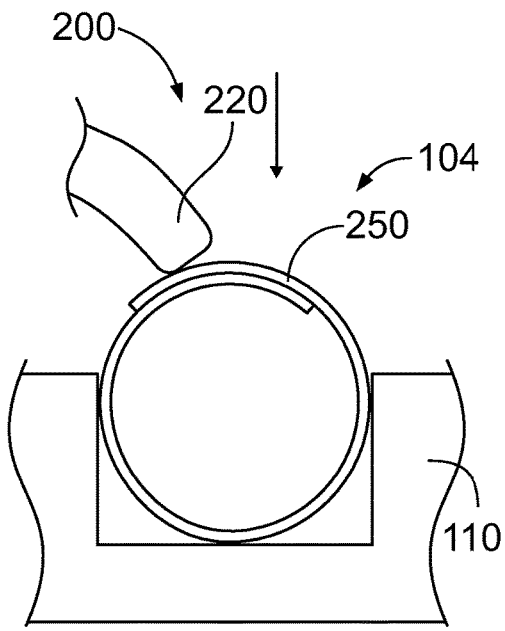
FIG. 9 is a cross sectional view of a portion of the receptacle connector assembly showing the gasket of the EMI shield in accordance with an exemplary embodiment.

FIG. 9 is a cross sectional view of a portion of the receptacle connector assembly 104 showing the gasket 250 of the EMI shield 200 in accordance with an exemplary embodiment. In the illustrated embodiment, the gasket 250 is a metal film. The metal film is looped into a tubular shape. The looped metal film is compressible. The gasket 250 is used to electrically connect the spring finger 220 to the receptacle cage 110. The gasket 250 may be coupled to the spring finger 220 and/or the receptacle cage 110 at a separable interface.

Figure 10:
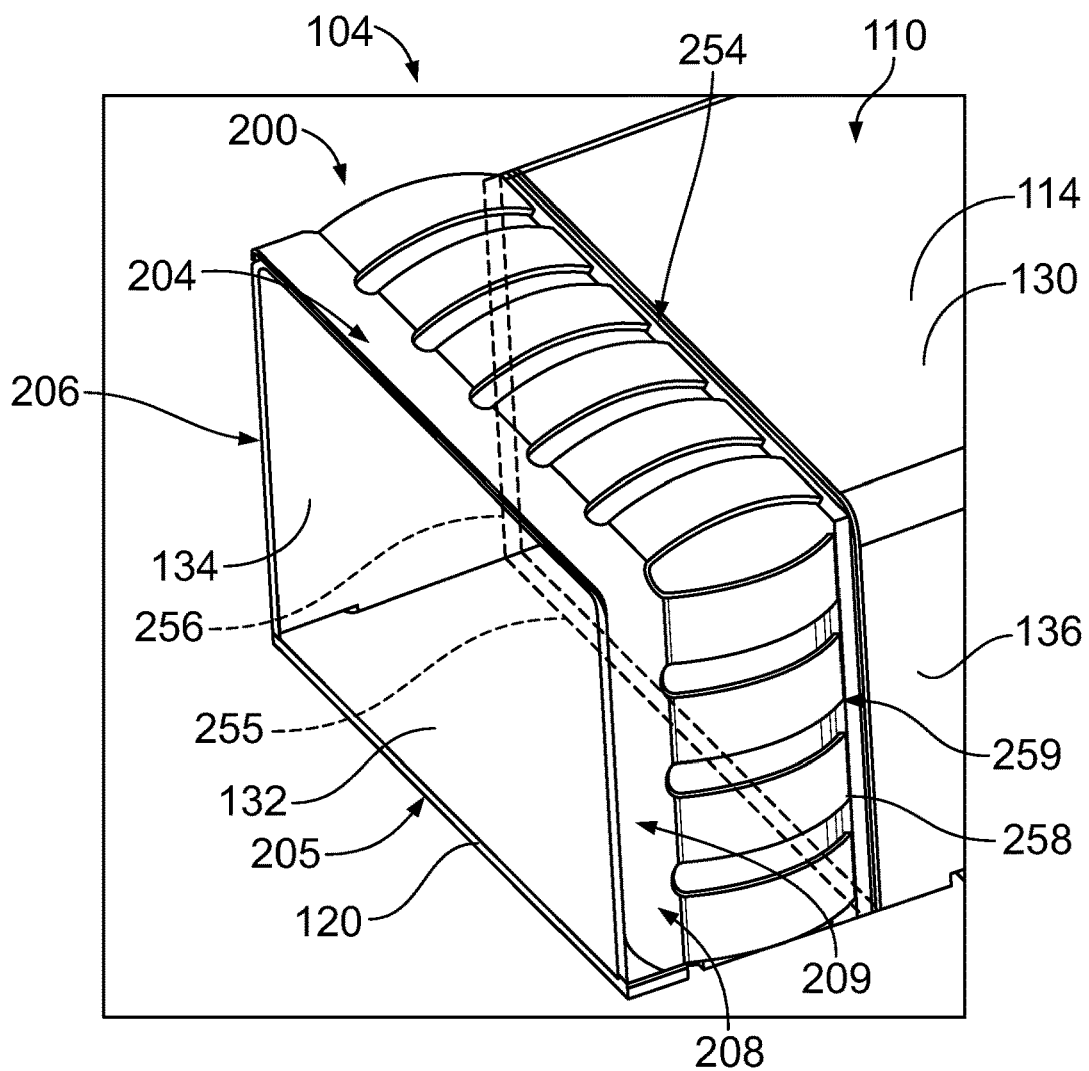
FIG. 10 is a perspective view of a portion of the receptacle connector assembly in accordance with an exemplary embodiment showing the front end of the receptacle cage and the EMI shield.

FIG. 10 is a perspective view of a portion of the receptacle connector assembly 104 in accordance with an exemplary embodiment showing the front end 120 of the receptacle cage 110 and the EMI shield 200. The EMI shield 200 completely surrounds the receptacle cage 110 in the illustrated embodiment. For example, the EMI shield 200 extends along the top wall 130, the bottom wall 132, the first side wall 134 and the second side wall 136. The EMI shield 200 includes the upper shield member 204, a lower shield member 205, the first side shield member 206, and the second side shield member 208. The upper shield member 204, the lower shield member 205, the first side shield member 206, and the second side shield member 208 are integral (for example, unitary), such as being stamped from a single metal sheet. The upper shield member 204, the lower shield member 205, the first side shield member 206, and the second side shield member 208 forms a band 209 completely surrounding the receptacle cage 110 at the front end 120.

In an exemplary embodiment, the EMI shield 200 includes the upper gasket 254, a lower gasket 255, the first side gasket 256, and the second side gasket 258. The upper gasket 254, the lower gasket 255, the first side gasket 256, and the second side gasket 258 are integral (for example, unitary), such as being formed from a continuous body. The upper gasket 254, the lower gasket 255, the first side gasket 256, and the second side gasket 258 form a loop 259 completely surrounding the receptacle cage 110. In the illustrated embodiment, the receptacle cage 110 is provided without the troughs 142 (shown in FIG. 4). Rather, the upper gasket 254, the lower gasket 255, the first side gasket 256, and the second side gasket 258 directly engage the exterior surfaces of the shielding walls 114.

Figure 11:
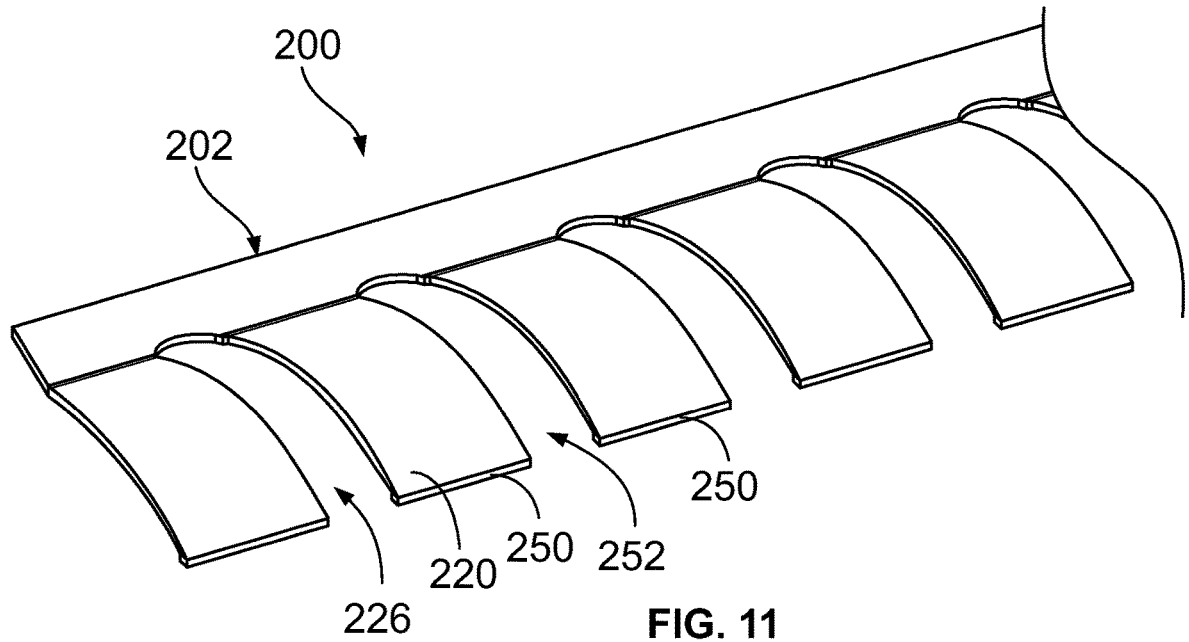
FIG. 11 is a perspective view of a portion of the EMI shield showing a portion of the shield member in accordance with an exemplary embodiment.

FIG. 11 is a perspective view of a portion of the EMI shield 200 showing a portion of the shield member 202 in accordance with an exemplary embodiment. In the illustrated embodiment, the EMI shield 200 includes a plurality of gaskets 250 rather than a single, elongated gasket. Each gasket 250 is connected to a corresponding one of the spring fingers 220. The gaskets 250 have widths approximately equal to widths of the spring fingers 220. The gaskets 250 are separated by gaps 252. The gaps 252 are aligned with the gaps 226. Each gasket 250 is configured to electrically connect the corresponding spring finger 220 and the receptacle cage 110 (shown in FIG. 1).

Figure 12:
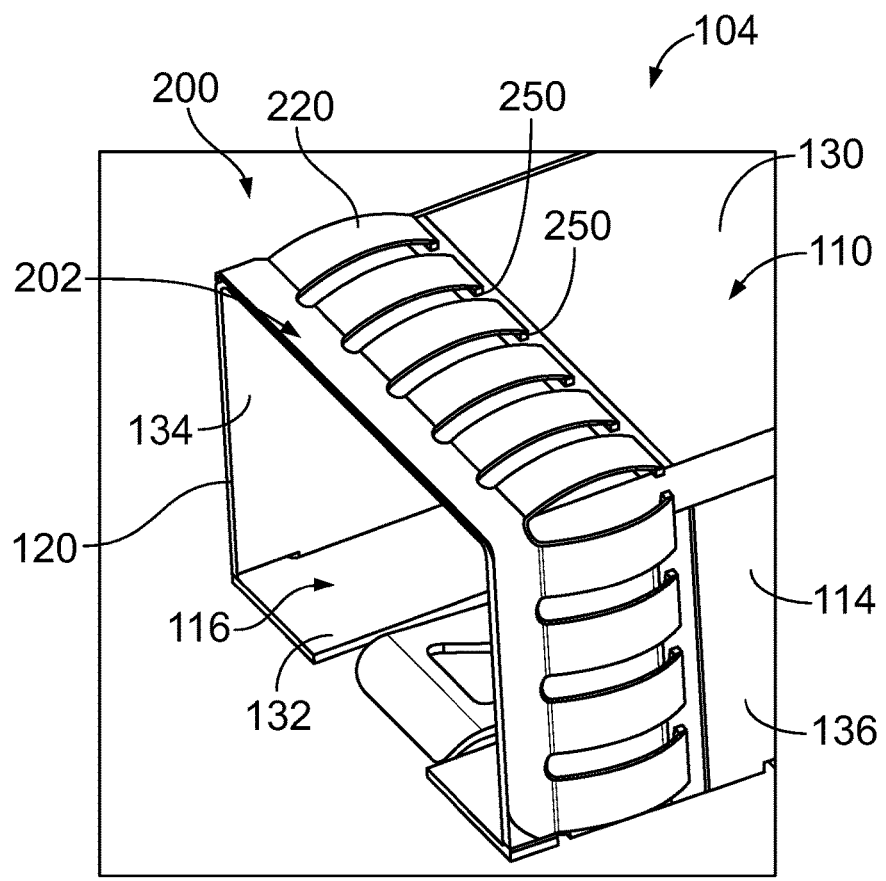
FIG. 12 is a perspective view of a portion of the receptacle connector assembly in accordance with an exemplary embodiment showing the front end of the receptacle cage and the EMI shield shown in FIG. 11.

FIG. 12 is a perspective view of a portion of the receptacle connector assembly 104 in accordance with an exemplary embodiment showing the front end 120 of the receptacle cage 110 and the EMI shield 200 shown in FIG. 11. The receptacle cage 110 includes the shielding walls 114, including the top wall 130, the bottom wall 132, and the side walls 134, 136, which define the module channel 116. The EMI shield 200 includes shield members 202 coupled to the shielding walls 114 and gaskets 250 coupled to each of the spring fingers 220.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A receptacle connector assembly comprising:
   a receptacle cage having shielding walls extending between a front end and a rear end of the receptacle cage, the shielding walls including a top wall, a first side wall extending from the top wall to a bottom of the receptacle cage, and a second side wall extending from the top wall opposite the first side wall to the bottom of the receptacle cage, wherein the top wall, the first side wall and the second side wall form a module channel configured to receive a pluggable module, the front end having a port open to the pluggable module to receive the pluggable module; and
   an electromagnetic interference (EMI) shield coupled to the receptacle cage at the front end, the EMI shield having a shield member including a base coupled to at least one of the shielding walls to electrically connect the EMI shield to the receptacle cage, the shield member including spring fingers extending from the base to distal ends, each spring finger including a panel interface configured to engage a panel surrounding the receptacle cage to electrically connect the EMI shield to the panel, the EMI shield including at least one gasket between the receptacle cage and the corresponding spring fingers, the at least one gasket electrically connecting the corresponding spring finger to the receptacle cage.

2. The receptacle connector assembly of claim 1, wherein the at least one gasket is compressible.

3. The receptacle connector assembly of claim 1, wherein the at least one gasket is electrically conductive.

4. The receptacle connector assembly of claim 1, wherein the at least one gasket includes an upper gasket, a first side gasket, and a second side gasket, the upper gasket being connected to the top wall, the first side gasket being coupled to the first side wall, the second side gasket being coupled to the second side wall.

5. The receptacle connector assembly of claim 4, wherein the upper gasket is connected to a plurality of the spring fingers along the top wall, the first side gasket is connected to a plurality of the spring fingers along the first side wall, and the second side gasket is connected to a plurality of the spring fingers along the second side wall.

6. The receptacle connector assembly of claim 4, wherein the shielding walls include a bottom wall between the first and second side walls, the at least one gasket includes a lower gasket connected to the bottom wall.

7. The receptacle connector assembly of claim 1, wherein the at least one gasket includes a plurality of upper gaskets, a plurality of first side gaskets, and a plurality of second side gaskets, the plurality of upper gaskets being connected to corresponding spring fingers along the top wall, the plurality of first side gaskets being coupled to corresponding spring fingers along the first side wall, the plurality of second side gaskets being coupled to corresponding spring fingers along the second side wall.

8. The receptacle connector assembly of claim 1, wherein each of the at least one gasket includes an inner gasket surface and an outer gasket surface, the inner gasket surface engages the receptacle cage, the outer gasket surface engages the distal end of the corresponding spring finger.

9. The receptacle connector assembly of claim 8, wherein the inner gasket surface is connected to the receptacle cage at a separable interface.

10. The receptacle connector assembly of claim 8, wherein the outer gasket surface is connected to the distal end of the corresponding spring finger at a separable interface.

11. The receptacle connector assembly of claim 1, wherein the EMI shield forms a band completely surrounding the receptacle cage at the front end, the at least one gasket including a single gasket forming a loop completely surrounding the receptacle cage.

12. The receptacle connector assembly of claim 1, wherein the at least one gasket includes individual gaskets connected to each of the corresponding spring fingers.

13. The receptacle connector assembly of claim 1, wherein the at least one gasket is a compressible conductive elastomer.

14. The receptacle connector assembly of claim 1, wherein the at least one gasket is one of a wire mesh or a woven metallic braid.

15. The receptacle connector assembly of claim 1, wherein the at least one gasket is conductive epoxy fixed to the receptacle cage.

16. A receptacle connector assembly comprising:
   a receptacle cage having shielding walls extending between a front end and a rear end of the receptacle cage, the shielding walls including a top wall, a first side wall extending from the top wall to a bottom of the receptacle cage, and a second side wall extending from the top wall opposite the first side wall to the bottom of the receptacle cage, wherein the top wall, the first side wall and the second side wall form a module channel configured to receive a pluggable module, the front end having a port open to the pluggable module to receive the pluggable module; and
   an electromagnetic interference (EMI) shield coupled to the receptacle cage at the front end, the EMI shield having an upper shield member including an upper base coupled to the top wall to electrically connect the EMI shield to the top wall, the upper shield member including upper spring fingers extending from the upper base to distal ends, each upper spring finger including a panel interface configured to engage a panel surrounding the receptacle cage to electrically connect the upper shield member to the panel, the EMI shield including an upper gasket between the receptacle cage and the upper spring fingers, the upper gasket electrically connecting the upper spring fingers, the upper gasket electrically connecting the upper spring fingers to the top wall.

17. The receptacle connector assembly of claim 16, wherein the EMI shield further comprises:
   a first side shield member including a first side base coupled to the first side wall to electrically connect the EMI shield to the first side wall, the first side shield member including first side spring fingers extending from the first side base to distal ends, each first side spring finger including a panel interface configured to engage the panel surrounding the receptacle cage to electrically connect the first side shield member to the panel, the EMI shield including a first side gasket between the receptacle cage and the first side spring fingers, the first side gasket electrically connecting the first side spring fingers, the first side gasket electrically connecting the first side spring fingers to the first side wall; and
   a second side shield member including a second side base coupled to the second side wall to electrically connect the EMI shield to the second side wall, the second side shield member including second side spring fingers extending from the second side base to distal ends, each second side spring finger including a panel interface configured to engage the panel surrounding the receptacle cage to electrically connect the second side shield member to the panel, the EMI shield including a second side gasket between the receptacle cage and the second side spring fingers, the second side gasket electrically connecting the second side spring fingers, the second side gasket electrically connecting the second side spring fingers to the second side wall.

18. The receptacle connector assembly of claim 17, wherein the shielding walls further comprise a bottom wall, and wherein the EMI shield further comprises a bottom shield member including a bottom base coupled to the bottom wall to electrically connect the EMI shield to the bottom wall, the bottom shield member including bottom spring fingers extending from the bottom base to distal ends, each bottom spring finger including a panel interface configured to engage the panel surrounding the receptacle cage to electrically connect the bottom shield member to the panel, the EMI shield including a bottom gasket between the receptacle cage and the bottom spring fingers, the bottom gasket electrically connecting the bottom spring fingers, the bottom gasket electrically connecting the bottom spring fingers to the bottom wall.

19. A receptacle connector assembly comprising:
   a receptacle cage having shielding walls extending between a front end and a rear end of the receptacle cage, the shielding walls including a top wall, a first side wall extending from the top wall to a bottom of the receptacle cage, and a second side wall extending from the top wall opposite the first side wall to the bottom of the receptacle cage, wherein the top wall, the first side wall and the second side wall form a module channel configured to receive a pluggable module, the front end having a port open to the pluggable module to receive the pluggable module, the receptacle cage including troughs along the exterior of the shielding walls; and
   an electromagnetic interference (EMI) shield coupled to the receptacle cage at the front end, the EMI shield having a shield member including spring fingers, the EMI shield including gaskets received in the corresponding troughs, the gaskets electrically connecting the corresponding spring fingers to the receptacle cage.

20. The receptacle connector assembly of claim 19, wherein the troughs are recessed in the shielding walls.

21. The receptacle connector assembly of claim 19, wherein the shield member including a base coupled to at least one of the shielding walls to electrically connect the EMI shield to the receptacle cage, the spring fingers extending from the base to distal ends, each spring finger including a panel interface configured to engage a panel surrounding the receptacle cage to electrically connect the EMI shield to the panel.

\* \* \* \* \*